US009059283B1

United States Patent
Chan et al.

(10) Patent No.: US 9,059,283 B1
(45) Date of Patent: Jun. 16, 2015

(54) SEMICONDUCTOR STRUCTURE

(71) Applicant: MACRONIX INTERNATIONAL CO., LTD., Hsinchu (TW)

(72) Inventors: Ching-Lin Chan, Yunlin County (TW); Cheng-Chi Lin, Yilan County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/556,366

(22) Filed: Dec. 1, 2014

(51) Int. Cl.
*H01L 29/78* (2006.01)
*H01L 21/336* (2006.01)
*H01L 29/66* (2006.01)

(52) U.S. Cl.
CPC ....... *H01L 29/7835* (2013.01); *H01L 29/66659* (2013.01)

(58) Field of Classification Search
CPC ............ H01L 29/1835; H01L 29/7816; H01L 29/6659; H01L 29/66681; H01L 29/0634
USPC ................................................. 257/328–345
See application file for complete search history.

(56) References Cited

U.S. PATENT DOCUMENTS

| | | | | |
|---|---|---|---|---|
| 8,704,312 | B2 * | 4/2014 | Cheng et al. | 257/342 |
| 8,969,958 | B1 * | 3/2015 | Khemka et al. | 257/341 |
| 2002/0053695 | A1 * | 5/2002 | Liaw et al. | 257/328 |
| 2011/0241114 | A1 * | 10/2011 | Su et al. | 257/343 |

\* cited by examiner

*Primary Examiner* — Cuong Q Nguyen
(74) *Attorney, Agent, or Firm* — McClure, Qualey & Rodack, LLP

(57) ABSTRACT

A semiconductor structure is provided. The semiconductor structure includes a first doped region, a second doped region, a field oxide layer, a gate structure, and a metal layer. The first doped region has a first type conductivity. The second doped region is formed in the first doped region and has a second type conductivity opposite to the first type conductivity. The field oxide layer is located on the first doped region. The gate structure includes a first gate portion and a second gate portion which are separated from each other, wherein the second gate portion is located on the field oxide layer and electrically connected to a source end. The metal layer is located on the gate structure and includes a first metal portion and a second metal portion which are separated from each other.

17 Claims, 5 Drawing Sheets

US 9,059,283 B1

SEMICONDUCTOR STRUCTURE

BACKGROUND

1. Technical Field

The disclosure relates in general to a semiconductor structure, and more particularly to a semiconductor structure having a stable threshold voltage.

2. Description of the Related Art

In the semiconductor technology, the feature size has been reduced in the recent decades. In the meantime, the rate, the efficiency, the density and the cost per integrated circuit unit have been improved. For semiconductor elements operated under high voltage or ultra-high voltage, such as metal oxide semiconductors (MOSs), issues regarding electrical performance usually arise while MOS transistors with reduced sizes are operated under high voltage.

Therefore, researchers are working on providing stable high voltage (HV) devices.

SUMMARY

The present disclosure relates to a semiconductor structure. In the embodiments, with the design of the gate structure in the semiconductor structure, the semiconductor structure has a stable threshold voltage.

According to an embodiment of the present disclosure, a semiconductor structure is provided. The semiconductor structure includes a first doped region, a second doped region, a field oxide layer, a gate structure, and a metal layer. The first doped region has a first type conductivity. The second doped region is formed in the first doped region and has a second type conductivity opposite to the first type conductivity. The field oxide layer is located on the first doped region. The gate structure includes a first gate portion and a second gate portion which are separated from each other, wherein the second gate portion is located on the field oxide layer and electrically connected to a source end. The metal layer is located on the gate structure and includes a first metal portion and a second metal portion which are separated from each other.

According to another embodiment of the present disclosure, a semiconductor structure is provided. The semiconductor structure includes a gate structure and a metal layer. The gate structure includes a first gate portion and a second gate portion separated from each other, wherein the first gate portion and the second gate portion have ring structures, and the first gate portion surrounds the second gate portion. The metal layer is located on the gate structure and includes a first metal portion and a second metal portion separated from each other, wherein the second gate portion is electrically connected to a source end through the second metal portion.

The disclosure will become apparent from the following detailed description of the preferred but non-limiting embodiments. The following description is made with reference to the accompanying drawings.

DETAILED DESCRIPTION

According to the embodiments of the present disclosure, a semiconductor structure is provided. In the embodiments, with the design of the gate structure in the semiconductor structure, the semiconductor structure has a stable threshold voltage. However, the following embodiments are for the purpose of elaboration only, not for limiting the scope of protection of the invention. Besides, secondary elements are omitted in the following embodiments to highlight the technical features of the invention.

Figure 1A:
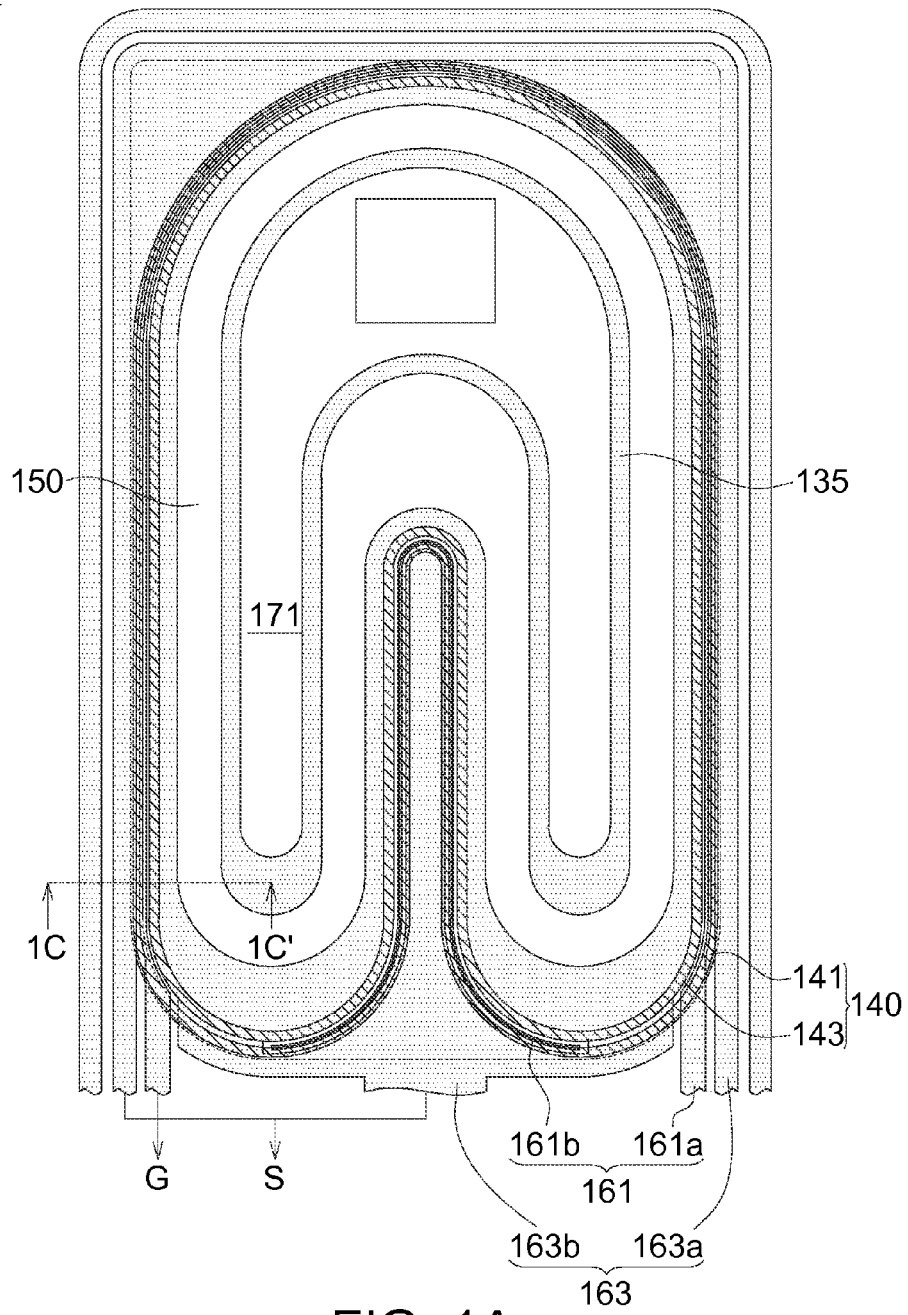
FIG. 1A shows a top view of a semiconductor structure according to an embodiment of the present disclosure.
Figure 1B:
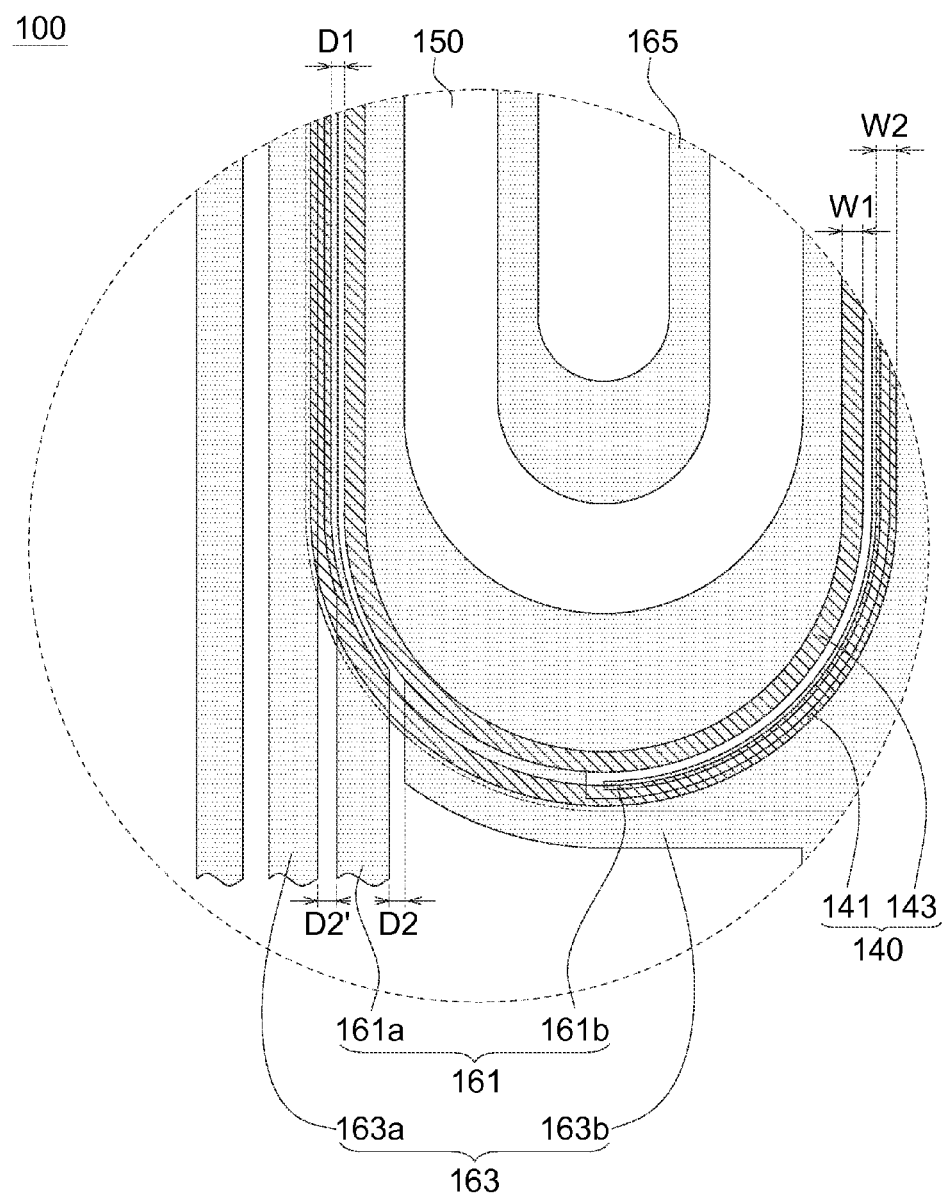
FIG. 1B shows a partial top view of the semiconductor structure in FIG. 1A.
Figure 1C:
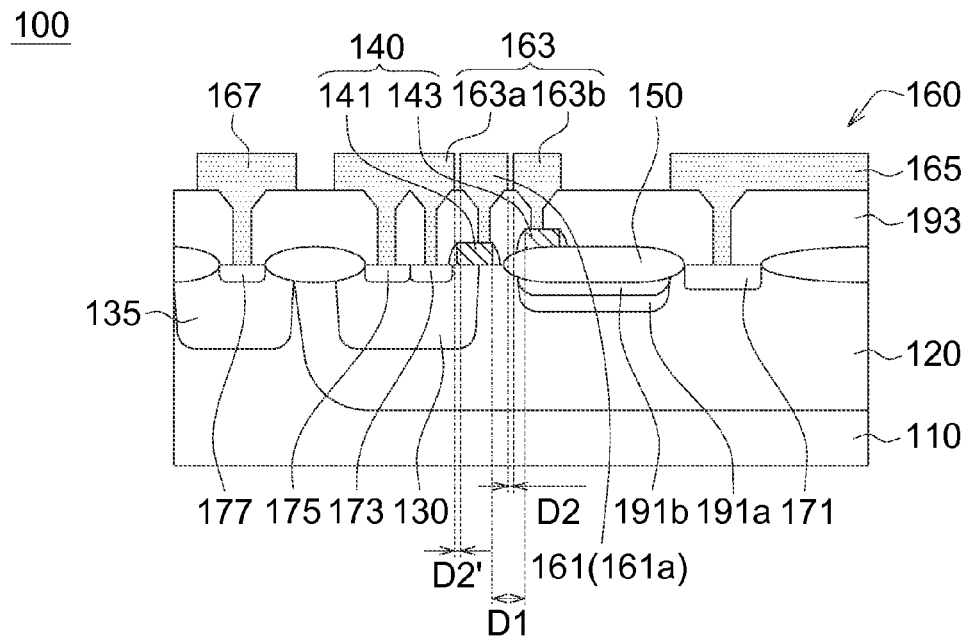
FIG. 1C shows a cross-sectional view of the semiconductor structure along the section line 1C-1C' in FIG. 1A.

Referring to FIGS. 1A-1C, FIG. 1A shows a top view of a semiconductor structure 100 according to an embodiment of the present disclosure, FIG. 1B shows a partial top view of the semiconductor structure 100 in FIG. 1A, and FIG. 1C shows a cross-sectional view of the semiconductor structure 100 along the section line 1C-1C' in FIG. 1A.

As shown in FIGS. 1A-1C, the semiconductor structure 100 includes a first doped region 12, a second doped region 130, a gate structure 140, a field oxide layer 150, and a metal layer 160. The first doped region 120 has a first type conductivity. The second doped region 130 is formed in the first doped region 120 and has a second type conductivity opposite to the first type conductivity. The field oxide layer 150 is located on the first doped region 120. The gate structure 140 includes a first gate portion 141 and a second gate portion 143 separated from each other, wherein the second gate portion 143 is located on the field oxide layer 150 and electrically connected to a source end S. The metal layer 160 includes a first metal portion 163 and a second metal portion 163 separated from each other.

In the embodiment, with the design of the gate structure 140 in the semiconductor structure 100, wherein the first gate portion 141 and the second gate portion 143 of the gate structure 140 are separated from each other, and the second gate portion 143 located on the field oxide layer 150 is electrically connected to the source end S, such that the semiconductor structure 100 can have a stable threshold voltage.

In the embodiment, as shown in FIG. 1A and FIG. 1C, the second gate portion 143 of the gate structure 140 is electrically connected to the source end S through the second metal portion 163 of the metal layer 160.

In the embodiment, as shown in FIGS. 1A-1C, the second metal portion 163 of the metal layer 160 further includes an outer C shaped structure 163a and an inner ring structure 163b. The outer C shaped structure 163a and the inner ring structure 163b are commonly electrically connected to the source end S. As shown in FIG. 1C, the second gate portion 143 of the gate structure 140 is electrically connected to the inner ring structure 163b of the second metal portion 163. In other words, the second gate portion 143 of the gate structure 140 is in fact in direct contact with the inner ring structure 163b of the second metal portion 163 of the metal layer 163, and hence electrically connected to the source end S.

In the embodiment, as shown in FIG. 1C, the drift region of the semiconductor structure 100 is located in the first doped region 120, and the field oxide layer 150 is located between the drift region and the second gate portion 143 of the gate structure 140.

In the embodiment, as shown in FIGS. 1A-1B, the first gate portion 141 and the second gate portion 143 of the gate structure 140 both have ring structures, and the first gate portion 141 surrounds the second gate portion 143.

In the embodiment, as shown in FIG. 1A and FIG. 1C, the first gate portion 141 of the gate structure 140 is located on the second doped region 130, and the first gate portion 141 is electrically connected to a gate voltage source G.

In the embodiment, as shown in FIG. 1A and FIG. 1C, the first gate portion 141 of the gate structure 140 is electrically connected to the gate voltage source G through the first metal portion 161 of the metal layer 160.

In the embodiment, as shown in FIGS. 1A-1C, the first metal portion 161 of the metal layer 160 further includes a first C shaped structure 161a. As shown in FIG. 1C, the first gate portion 141 is electrically connected to the first C shaped structure 161a of the first metal portion 161. In other words, the first gate portion 141 of the gate structure 140 is in face in direct contact with the first C shaped structure 161a of the first metal portion 161 of the metal layer 160, and hence electrically connected to the gate voltage source G.

In the embodiment, with the design of the gate structure 140 in the semiconductor structure 100, not only the second gate portion 143 on the field oxide layer 150 is electrically connected to the source end S, but the first gate portion 141 on the second doped region 130 is also electrically connected to the gate voltage source G. That is, the two separated portions of the gate structure 140 are electrically connected to the source end S and the gate voltage source G, respectively, such that the semiconductor structure 100 can have a stable threshold voltage.

Specifically speaking, in the semiconductor structure 100, the electrical connection is achieved by the metal wires of the single-layered metal layer 160. However, while the single-layered metal layer is arranged together with a traditional gate structure, a phenomenon similar to secondary conduction may easily occur while a gate voltage is applied, such that the threshold voltage may increase. According to the embodiments of the present disclosure, with the design of the gate structure 140 in the semiconductor structure 100, the two separated portions of the gate structure 140 are connected to the source end S and the gate voltage source G, respectively; particularly, the first gate portion 141 located on the outer side is electrically connected to the gate voltage source G, and the second gate portion 143 located on the inner side is electrically connected to the source end S. As such, the secondary conduction may be prevented; accordingly, the threshold voltage may be decreased, and the effects of the semiconductor structure 100 having a stable threshold voltage can be achieved.

In the embodiment, as shown in FIGS. 1A-1C, the first gate portion 141 of the gate structure 140 has a first width W1, the second gate portion 143 of the gate structure 140 has second width W2, and the first width W1 and the second width W2 may be the same or different.

In the embodiment, as shown in FIGS. 1A-1C, the first C shaped structure 161a of the first metal portion 161 is located between the outer C shaped structure 163a and the inner ring structure 163b of the second metal portion 163.

In the embodiment, as shown in FIG. 1A, the first metal portion 161 of the metal layer 160 further includes a second C shaped structure 161b, and the second metal portion 163 surrounds the second C shaped structure 161b of the first metal portion 161.

In details, as shown in FIG. 1A, in the embodiment, the inner ring structure 163b of the second metal portion 163 surrounds the second C shaped structure 161b of the first metal portion 161.

In the embodiment, the second C shaped structure 161b of the first metal portion 161 is surrounded by the inner ring structure 163b of the second metal portion 163, and the second C shaped structure 161b of the first metal portion 161 is electrically connected to the first gate portion 141 of the gate structure 140 as well. As a result, the first C shaped structure 161a together with the second C shaped structure 161b of the first metal portion 161 is arranged substantially along the distribution of the first gate portion 141 of the gate structure 140. Therefore, while a gate voltage is applied, the conduction of all of the regions of the first gate portion 141 is substantially uniform, and hence the switching speed of the device of the semiconductor structure 100 can be increased.

In the embodiment, as shown in FIG. 1C, the semiconductor structure 100 can further includes a first doped electrode region 171, a second doped electrode region 173, and a third doped electrode region 175. The first doped electrode region 171 is formed in the first doped region 120. The second doped electrode region 173 and the third doped electrode region 175 are formed in the second doped region 130. The second doped electrode region 173 and the third doped electrode region 175 are electrically connected to the second metal portion 163 of the metal layer 160.

In the embodiment, as shown in FIGS. 1A-1C, the metal layer 160 further includes a third metal portion 165. The third metal portion 165 is separated from the first metal portion 161 and the second metal portion 163. As shown in FIG. 1C, the third metal portion 165 is electrically connected to the first doped electrode region 171.

In the embodiment, as shown in FIGS. 1A-1C, the first gate portion 141 and the second gate portion 143 of the gate structure 140 are separated by a first distance D1, the first metal portion 161 and the second metal portion 163 of the metal layer 160 are separated by a second distance D2. The first distance D1 is such as larger than or equal to the second distance D2.

Specifically speaking, the second distance between the first metal portion 161 and the second metal portion 163 may be the second distance D2 between the first C shaped structure 161a of the first metal portion 161 and the inner ring structure 163b of the second metal portion 163, and may be the second distance D2' between the first C shaped structure 161a of the first metal portion 161 and the outer C shaped structure 163a of the second metal portion 163. The first distance D1 is such as larger than or equal to the second distance D2'. In the embodiment, the second distance D2 and the second distance D2' may be the same or different.

As shown in FIGS. 1B-1C, the semiconductor structure 100 can further includes a substrate 110, a third doped region 135, a top doped region 191a, a doped layer 191b, and a fourth doped electrode region 177. The first doped region 120 and the third doped region 135 are formed in the substrate 110. The fourth doped electrode region 177 is formed in the third doped region 135. The top doped region 191a is formed in the first doped region 120, and the doped layer 191b is formed in the top doped region 191a.

In the embodiment, the semiconductor structure 100 may further include a dielectric layer 193, and the metal layer 160 may include a fourth metal portion 167. The metal layer 160 is electrically connected to the elements or doped regions below the dielectric layer 193 through the contact holes within the dielectric layer 193. The fourth metal portion 167 is electrically connected to the fourth doped electrode region 177.

In the embodiment, the first doped region 120 and the doped layer 191b have the first type conductivity of such as N type conductivity. The first doped region 120 is such as a high voltage N well (HVNW), and the doped layer 191b is such as an N-grade implant. The substrate 110, the second doped region 130, the third doped region 135, the third doped electrode region 175, the fourth doped electrode region 177, and the doped region 191a have the second type conductivity of such as P type conductivity, which is opposite to the first type conductivity. The substrate 110 is such as a P type substrate or a P-epi.

In one embodiment, the semiconductor structure 100 is a MOS device. In this case, the first doped electrode region 171 and the second doped electrode region 173 have the first type conductivity, such as N type conductivity. The first doped electrode region 171 is used as the drain, and the second doped electrode region 173 is used as the source.

In another embodiment, the semiconductor structure 100 is an IGBT device. In this case, the first doped electrode region 171 has the second type conductivity, such as P type conductivity. The second doped electrode region 173 has the first type conductivity, such as N type conductivity. The first doped electrode region 171 is used as the anode, and the second doped electrode region 173 is used as the cathode.

Figure 2:
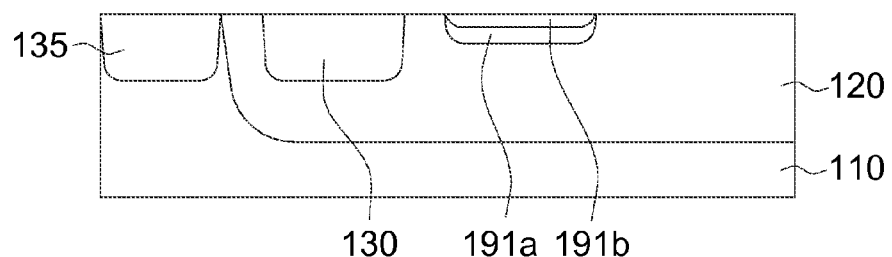
FIGS. 2-4 illustrate a process for manufacturing a semiconductor structure according to an embodiment of the present disclosure.
Figure 3:
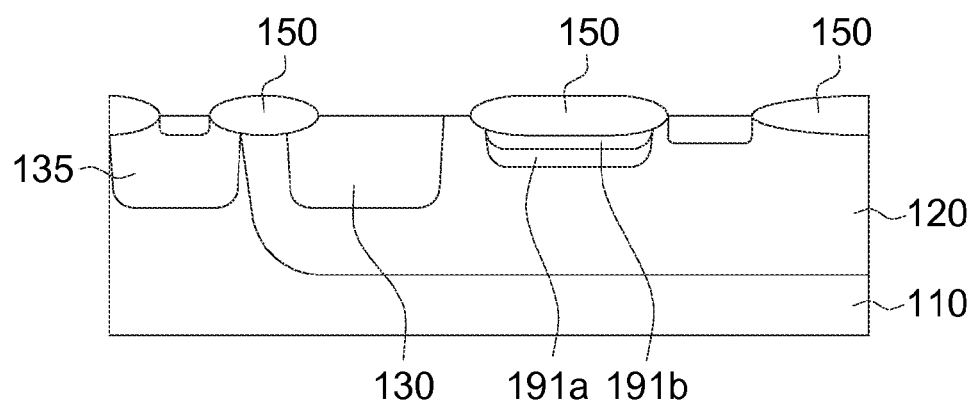
Figure 4:
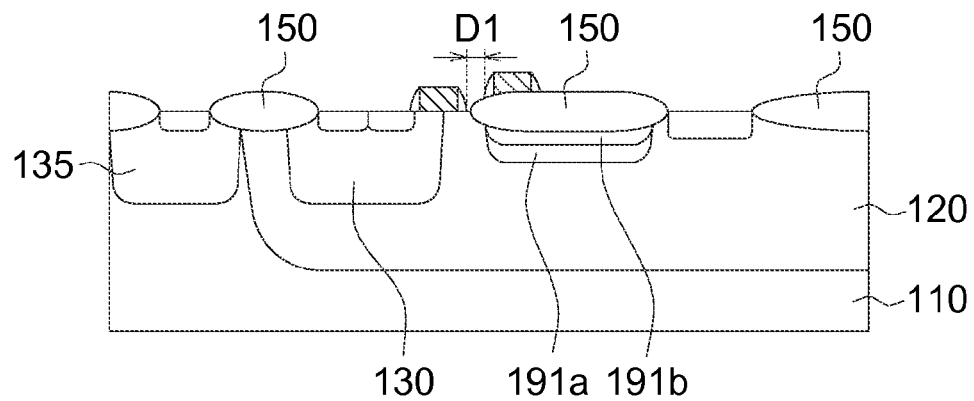

FIGS. 2-4 illustrate a process for manufacturing a semiconductor structure 100 according to an embodiment of the present disclosure.

As shown in FIG. 2, the substrate 110, such as bulk silicon or a SOI, is provided. The first doped region 120 is formed in the substrate 110. The second doped region 130 is formed in the first doped region 120. The third doped region 135 is formed in the substrate 110. In one embodiment, the first doped region 120 has the first type conductivity of such as N type conductivity, and the second doped region 130 and the third doped region 135, both having the second type conductivity of such as P type conductivity, are simultaneously formed by using the same mask. Next, the top doped region 191a is formed in the first doped region 120, and the doped layer 191b is formed in the top doped region 191a. In the embodiment, the top doped region 191a and the doped layer 191b are respectively formed by using different masks.

As shown in FIG. 3, the field oxide layer 150 is formed on the doped layer 191b. The field oxide layer 150 can further be formed on the first doped region 120, and between the second doped region 130 and the third doped region 135. The field oxide layer 150 is not limited to a FOX as shown in FIG. 3. The field oxide layer 150 may comprise other suitable dielectric structures.

Next, as shown in FIG. 4, the gate structure 140 is formed on the first doped region 120 and the second doped region 130. In the embodiment, the gate structure 140 may comprise a polysilicon layer and a metal silicide layer, such as tungsten silicide, formed on the polysilicon layer. The spacer of the gate structure 140 may comprise silicon dioxide, such as tetraethoxy silane (TEOS).

In the embodiment, the manufacturing method of the gate structure 140 includes such as the following steps. A polysilicon layer and a metal silicide layer are formed. And then, the polysilicon layer and the metal silicide layer are patterned by a mask etching process to form the first gate portion 141 and the second gate portion 143 separated from each other. Next, the spacers are formed on the sidewalls. As such, the gate structure 140 as shown in FIG. 4 is formed. In the embodiment, the above-mentioned gate structure 140 is formed in one mask etching process.

Next, referring to FIGS. 1A-1C, the first doped electrode region 171 is formed in the first doped region 120. The second doped electrode region 173 and the third doped electrode region 175 are formed in the second doped region 130. The fourth doped electrode region 177 is formed in the third doped region 135. In the embodiment, the first doped electrode region 171, the second doped electrode region 173, the third doped electrode region 175, and the fourth doped electrode region 177 are formed by a heavy doping.

Next, referring to FIGS. 1A-1C, the dielectric layer 193 is formed on the substrate 110. The metal layer 160 is formed by filling a conductive material into the openings (contact holes) of the dielectric layer 193 and then patterning the conductive material. The metal layer 160 comprise such as W, Cu, Al, and so on.

Figure 5A:
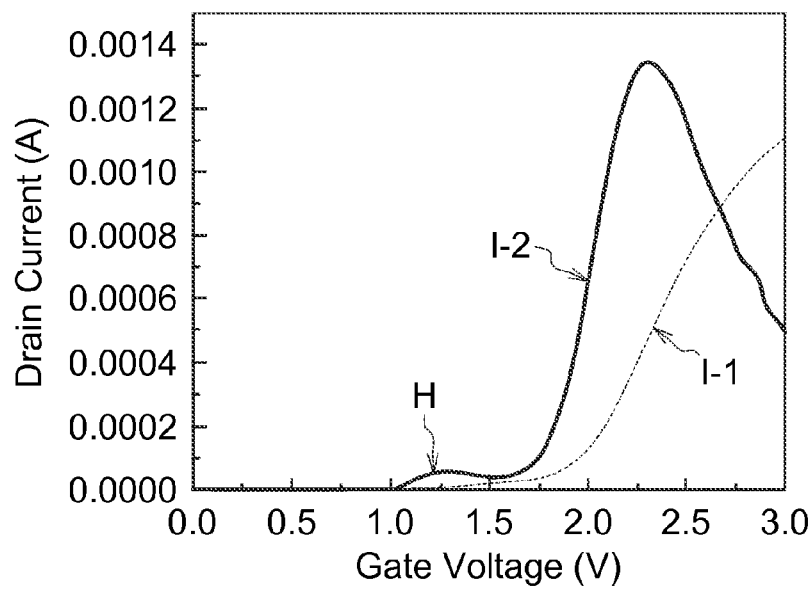
FIG. 5A illustrates I-V curves of a semiconductor structure according to a comparative embodiment of the present disclosure.
Figure 5B:
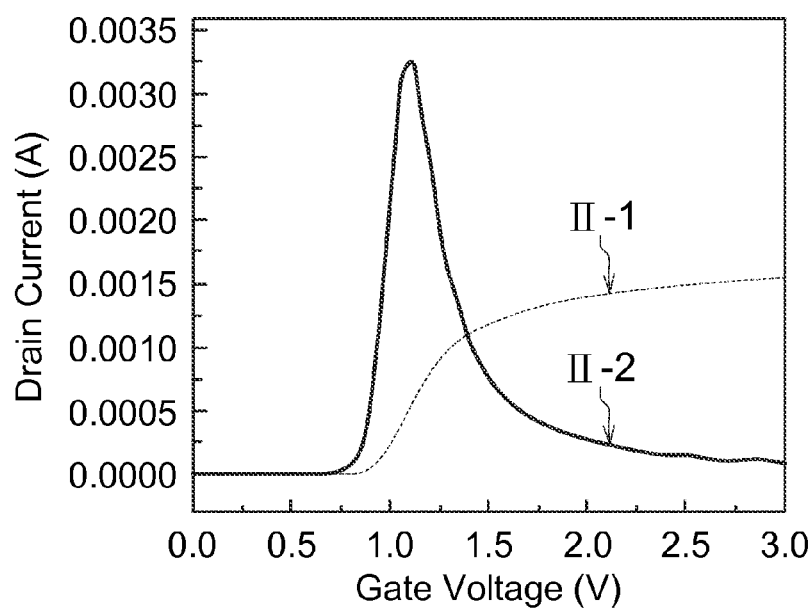
FIG. 5B illustrates I-V curves of a semiconductor structure according to an embodiment of the present disclosure.

FIG. 5A illustrates I-V curves of a semiconductor structure according to a comparative embodiment of the present disclosure, and FIG. 5B illustrates I-V curves of a semiconductor structure 100 according to an embodiment of the present disclosure. In the embodiment, the semiconductor structure 100 can be applied for a HV, ultra-HV (such as 300V~1000V) device, such as MOS, IGBT, and diode.

As shown in FIG. 5A, curve I-1 represents the I-V curve of a semiconductor structure without the gate structure according to the embodiments of the present disclosure, and curve I-2 represents the linear differential curve of curve I-1. As shown in FIG. 5B, curve II-1 represents the I-V curve of a semiconductor structure 100 according to the embodiments of the present disclosure, and curve II-2 represents the linear differential curve of curve II-1. As shown in FIG. 5A, in a conventional semiconductor structure, which includes a single-layered metal layer yet without the gate structure 140 as illustrated in the above-mentioned embodiments, the linear differential curve (curve I-2) of the I-V curve shows a hump H from a secondary conduction, causing an increase of the threshold voltage of up to about 1.73 V. In contrast, as shown in FIG. 5B, according to the embodiments of the present disclosure, the linear differential curve (curve II-2) of the I-V curve of the semiconductor structure 100 shows no hump, and of which the threshold voltage is about 0.9 V.

In other words, according to the embodiments of the present disclosure, with the design of the gate structure 140 in the semiconductor structure 100, the secondary conduction from applying a gate voltage can be prevented, and hence the threshold voltage can be lowered; accordingly, the effects of the semiconductor structure 100 having a stable threshold voltage can be achieved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a first doped region having a first type conductivity;
   a second doped region formed in the first doped region and having a second type conductivity opposite to the first type conductivity;
   a field oxide layer located on the first doped region;
   a gate structure, comprising a first gate portion and a second gate portion separated from each other, wherein the second gate portion is located on the field oxide layer and electrically connected to a source end; and
   a metal layer located on the gate structure, the metal layer comprising a first metal portion and a second metal portion separated from each other.

2. The semiconductor structure according to claim 1, wherein the second gate portion is electrically connected to the source end through the second metal portion.

3. The semiconductor structure according to claim 1, wherein the first gate portion is located on the second doped region, and the first gate portion is electrically connected to a gate voltage source.

4. The semiconductor structure according to claim 3, wherein the first gate portion is electrically connected to the gate voltage source through the first metal portion.

5. The semiconductor structure according to claim 1, further comprising:
   a drift region located in the first doped region, wherein the field oxide layer is located between the second gate portion and the drift region.

6. The semiconductor structure according to claim 1, further comprising:
   a first doped electrode region formed in the first doped region; and
   a second doped electrode region and a third doped electrode region formed in the second doped region, wherein the second doped electrode region and the third doped electrode region are electrically connected to the second metal portion.

7. The semiconductor structure according to claim 6, wherein the metal layer further comprises a third metal portion, and the third metal portion is separated from the first metal portion and the second metal portion, wherein the third metal portion is electrically connected to the first doped electrode region.

8. The semiconductor structure according to claim 1, wherein the first gate portion and the second gate portion are separated by a first distance, the first metal portion and the second metal portion are separated by a second distance, and the first distance is larger than or equal to the second distance.

9. A semiconductor structure, comprising:
   a gate structure, comprising a first gate portion and a second gate portion separated from each other, wherein the first gate portion and the second gate portion have ring structures, and the first gate portion surrounds the second gate portion; and
   a metal layer located on the gate structure, the metal layer comprising a first metal portion and a second metal portion separated from each other, wherein the second gate portion is electrically connected to a source end through the second metal portion.

10. The semiconductor structure according to claim 9, wherein the first gate portion is electrically connected to a gate voltage source through the first metal portion.

11. The semiconductor structure according to claim 9, wherein the first metal portion comprises a first C shaped structure.

12. The semiconductor structure according to claim 11, wherein the second metal portion comprises an outer C shaped structure and an inner ring structure, and the first C shaped structure is located between the outer C shaped structure and the inner ring structure.

13. The semiconductor structure according to claim 9, wherein the second metal portion comprises an outer C shaped structure and an inner ring structure, wherein the outer C shaped structure and the inner ring structure are commonly electrically connected to the source end, and the second gate portion is electrically connected to the inner ring structure.

14. The semiconductor structure according to claim 9, wherein the first metal portion comprises a second C shaped structure, and the second metal portion surrounds the second C shaped structure.

15. The semiconductor structure according to claim 14, wherein the second metal portion comprises an outer C shaped structure and an inner ring structure, and the inner ring structure surrounds the second C shaped structure.

16. The semiconductor structure according to claim 9, wherein the first gate portion has a first width, the second gate portion has a second width, and the first width and the second width are the same or different.

17. The semiconductor structure according to claim 9, wherein the first gate portion and the second gate portion are separated by a first distance, and first metal portion and the second metal portion are separated by a second distance, and the first distance is larger than or equal to the second distance.

* * * * *